United States Patent [19]
Tai

[11] Patent Number: 5,973,632
[45] Date of Patent: Oct. 26, 1999

[54] SUB-RANGE FLASH ANALOG-TO-DIGITAL CONVERTER

[75] Inventor: Jy-Der David Tai, Hsin-Chu, Taiwan

[73] Assignee: Powerchip Semiconductor Corp., Hsin-Chu, Taiwan

[21] Appl. No.: 09/034,532

[22] Filed: Mar. 3, 1998

[51] Int. Cl.[6] .................................................. H03M 1/12
[52] U.S. Cl. .......................................... 341/156; 341/155
[58] Field of Search .................................... 341/156, 139, 341/155, 158, 160, 161

[56] References Cited

U.S. PATENT DOCUMENTS

| | | | |
|---|---|---|---|
| 5,099,240 | 3/1992 | Nakatani et al. | 341/156 |
| 5,400,029 | 3/1995 | Kobayashi | 341/156 |
| 5,621,409 | 4/1997 | Cotter et al. | 341/156 |
| 5,682,163 | 10/1997 | Hsu | 341/156 |
| 5,726,653 | 3/1998 | Hsu et al. | 341/156 |
| 5,745,067 | 4/1998 | Chou et al. | 341/156 |
| 5,748,132 | 5/1998 | Matsuzawa | 341/156 |
| 5,841,389 | 11/1998 | Kinugasa et al. | 341/159 |

*Primary Examiner*—Brian Young
*Assistant Examiner*—Peguy Jean Pierre
*Attorney, Agent, or Firm*—Ladas & Parry

[57] ABSTRACT

A sub-range flash ADC having correction circuits for dealing with conversion errors induced by the coarse comparison in the thermal code format. Fine thermal codes accompanied by extension codes may be used to decide whether a conversion error has happened and what kind of conversion error it is. After determining whether a conversion error has occurred, the coarse thermal codes are shifted right or left by one bit, similar to the addition or subtraction mathematical operation, to obtain corrected coarse thermal codes. In addition, the fine thermal codes (including the extension thermal codes) are shifted left or right by a bit length equal to the fine thermal codes, similar to the subtraction and addition operation, to obtain corrected fine thermal codes. These corrected coarse and fine thermal codes can be directly used for encoding without any further correction process.

7 Claims, 9 Drawing Sheets

QC2=0 and VI'>1MSB

|  | | | QC4 | QC3 | QC2 | QC1 | | |
|---|---|---|---|---|---|---|---|---|
| (QC) | | | 0 | 0 | 1 | 1 | | |

|  | | | | | | | | |
|---|---|---|---|---|---|---|---|---|
| (QC') | | | 0 | 0 | 1 | 1 | | |

|  | TU2 | TU1 | QF4 | QF3 | QF2 | QF1 | TL1 | TL2 |
|---|---|---|---|---|---|---|---|---|
| (QF) | 0 | 0 | 0 | 0 | 0 | 1 | 1 | 1 |

|  | | | | | | | | |
|---|---|---|---|---|---|---|---|---|
| (QF') | | | | 0 | 0 | 0 | 1 | |

QC2=1 and VI'>1MSB

(QC)  QC4 QC3 QC2 QC1
| 0 | 0 | 1 | 1 |

(QC')
| 0 | 0 | 1 | 1 |

(QF)  TU2 TU1 QF4 QF3 QF2 QF1 TL1 TL2
| 0 | 0 | 0 | 0 | 0 | 0 | 1 | 1 |

(QF')
| 0 | 0 | 0 | 0 |

QC2=1 and VI'=1MSB

QC2=1 and VI'<1MSB

FIG. 4D

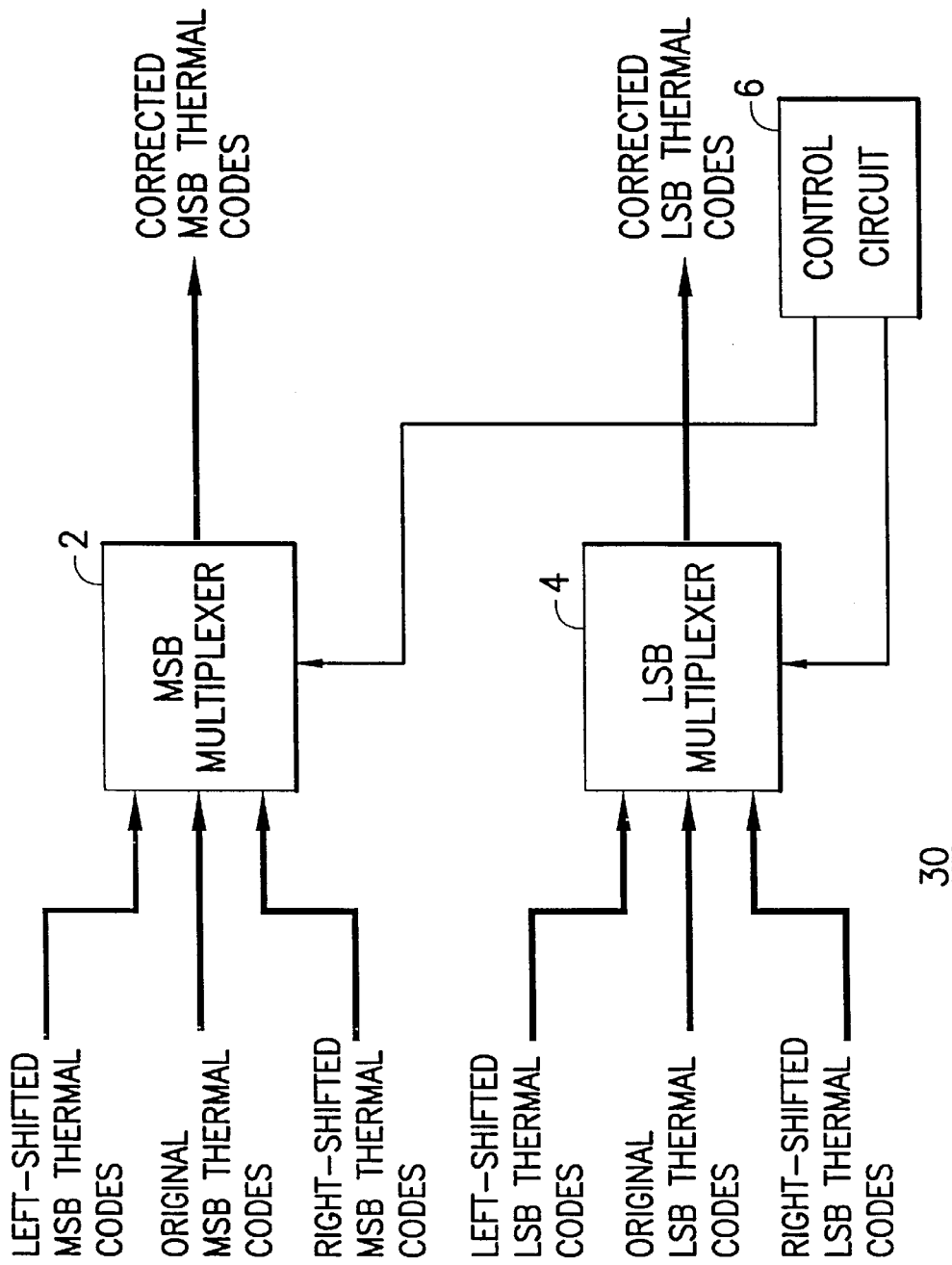

SUB-RANGE FLASH ANALOG-TO-DIGITAL CONVERTER

BACKGROUND OF THE INVENTION

1. Field of the Invention

The present invention relates in general to a sub-range flash-type analog-to-digital converter (hereafter called ADC), more specifically, to a flash analog-to-digital converter employing a thermal code correction scheme for correcting the mismatch between a coarse comparison and a fine comparison.

2. Description of the Related Art

Flash-type ADCs are extremely useful in high-speed applications. Fundamentally, ADCs are devices for converting analog signals to digital signals. In the conventional flash-type ADC, signal representation conversion is implemented by a direct level comparison, thereby decreasing the conversion time.

Basic flash ADCs compare the input analog signal with a set of predefined reference voltages, which are evenly spaced between a top reference voltage and a bottom reference voltage. It is evident that the basic flash ADCs need many comparators to fulfill the conversion operation. More specifically, an n-bit ADC requires $2^n-1$ comparators. For example, a 10-bit ADC must include 1023 comparators. Such a large number of comparators produces ADC implementation difficulties, including the need for a large amount of chip size, loading of the input analog signal, and differential and integral errors.

A sub-ranging technique is used to lessen these unwanted phenomena. In a sub-range flash ADC, the analog-to-digital conversion is implemented by two separate smaller sub-ADCs. The first sub-ADC is used to implement a coarse conversion and generates a series of most significant bits (hereafter called MSBs). The second sub-ADCs is used to implement a fine conversion in accordance with the conversion result of the coarse conversion and generates a series of least significant bits (hereafter called LSBs). Note that the total bit number of the MSBs and LSBs are equal to the bit number of the desired output digital signal of the complete ADC. For example, a 10-bit converter may be implemented by 4 MSBs and 6 LSBs, or by 5 MSBs and 5 LSBs. In addition, the total number of the required comparators may be obtained by summing the respective number of the comparators included in both of the separate sub-ADCs. For example, there are $(2^5-1)+(2^5-1)=62$ comparators in a 10-bit converter with 5 MSBs and 5 LSBs. Clearly, this approach help avoid the large quantity of comparators and the inherent drawbacks in the basic ADC.

In sub-range flash ADCs, the cooperation between the MSB sub-ADC and the LSB sub-ADC is a critical issue. U.S. Pat. No. 5,400,029 disclosed a sub-range flash ADC employing an intelligent cooperation scheme. FIG. 1 schematically illustrates the block diagram of the disclosed prior art sub-range flash ADC. As shown in FIG. 1, the flash ADC includes reference voltage generator 10, coarse comparing circuit 12, fine comparing circuit 14, multiplexer 16, subtraction/addition circuit 18 and logic circuit 20. Reference voltage generator 10 is used to provide a set of coarse reference voltages VRC evenly spaced between top reference voltage REF+ and bottom reference voltage REF−, and a set of fine reference voltages VRF evenly spaced within a coarse reference voltage range. Usually, reference voltage generator 10 is implemented by many resistors serially connected with each other, wherein top voltage REF+ and bottom voltage REF− are provided at both ends of these resistors. These coarse reference voltages VRC are used for coarse comparison, and, therefore, are provided to coarse comparing circuit 12. After comparing these coarse reference voltages VRC with input analog signal VI, coarse comparing circuit 12 then generates a first group of thermal codes QC representing the comparison result. The thermal codes are in a binary data format, composed of a series of data "0" followed by a series of data "1." In ADCs, each thermal code represents a comparison result of the corresponding comparator. When the corresponding reference voltage is higher than the input analog signal, the corresponding thermal code shows the data "0." When the corresponding reference voltage is below that of the input analog signal, the corresponding thermal code shows the data "1." Therefore, the intersection of the "0" series and the "1" series in the thermal codes QC indicates the coarse level of the input analog signal VI.

Multiplexer 16 and subtraction/addition circuit 18 are used to produce an intermediate analog signal VI', which is applied to fine comparing circuit 14 for fine comparison. Intermediate analog signal VI' is original input signal VI subtracted or added by a selected reference voltage VSEL, which is one of the coarse reference voltages VRC. The selected reference voltage VSEL represents a base voltage for moving input analog signal VI into a voltage range defined by the fine reference voltages VRF. Multiplexer 16 selects reference voltage VSEL from the coarse reference voltages VRC, controlled by the coarse thermal codes QC. Then subtraction/addition circuit 18 moves input analog signal VI into the voltage range defined by the fine reference voltages VRF.

The fine reference voltages VRF are evenly spaced between the voltage range by itself. Fine comparing circuit 14 compares the fine reference voltages VRF with the intermediate input signal VI', respectively, and generates the fine thermal codes QF. Finally, logic circuit 20 interprets the coarse thermal codes QC and the fine thermal codes QF and produces the output digital signal VO corresponding to the input analog signal VI.

Besides the above-indicated sub-range flash ADC, other sub-range flash ADCs may employ a slightly different approach to deal with the fine conversion. For example, in some ADCs, the multiplexer and the subtraction/addition circuit may be omitted and the original input analog signal is directly applied to the fine comparing circuit. In addition, the reference voltage generator may generate many groups of the fine reference voltages, respectively corresponding to one voltage range defined by two adjacent coarse reference voltages. One group of the fine reference voltages is selected in accordance with the coarse comparison and directly fed to the fine comparison circuit for fine conversion. However, such a sub-range flash ADC may require a lot of switching devices.

Further attention must be paid to fine comparing circuit 14 and the fine reference voltages VRF. Typically, some additional fine reference voltages (hereafter called the extension reference voltages) are provided to fine comparing circuit 14 together with the fine reference voltages VRF. These extension reference voltages usually include two portions, one being higher than the fine reference voltages and the other being lower than the fine reference voltages. In addition, fine comparing circuit 14 also includes additional comparators for comparing these extension reference voltages with the intermediate input signal VI'. These extension reference voltages are used to correct the error due to the separate coarse and fine conversion and will be discussed in the following paragraph.

FIG. 2A illustrates the prior art conversion operation of a sub-range flash ADC using the coarse conversion scheme, while FIG. 2B illustrates the fine conversion scheme.

In this simplified example, the coarse reference voltages, denoted by REF+, VRC3, VRC2, VRC1 and REF−, are used to perform a two-bit conversion and the fine reference voltages, denoted by VRC2, VRF3, VRF2, VRF1 and VRC1, are also used to perform a two-bit conversion. Therefore, this ADC is a 4-bit converter. Any input value may be located in one of the four voltage ranges defined by two adjacent coarse reference voltages. As described above, if the input value is located between the voltages REF+ and VRC3, the base voltage for moving the input value to the predefined fine comparison voltage range, denoted by VSEL in the above description, is the reference voltage VRC2. After being subtracted by the reference voltage VRC2, the input value is moved to the voltage range defined between the voltages VRC1 and VRC2. Then, in order to complete the analog-to-digital conversion, the fine comparison is performed by using VRF1, VRF2 and VRF3,. However, a conversion error in a sub-range flash ADC may happen when the input value is close to any coarse reference voltage, such as VRC1, VRC2 or VRC3.

As shown in FIG. 2A, consider an input analog signal VI to be close to the reference voltage VRC2. Assume that the true input analog signal VI is slightly higher than the coarse reference voltage VRC2. This means that the input analog signal VI is located within the voltage range between the reference voltages VRC2 and VRC3. However, if the difference voltage between the voltages VRC2 and VI is very small, for example, less than 2 mV, and the coarse comparator cannot detect such a small voltage, a conversion error happens. In such a situation, extension reference voltages, U1–U2 as seen in FIG. 2B, may be used to detect this kind of error. When the fine comparing circuit detects that the intermediate input signal VI' (same as VI in this case) is located in the voltage range between VRC2 and U1, logic circuit 20 can perform an error correction operation to modify the output digital signal. The extension reference voltages L1 and L2, also shown in FIG. 2B, are used for the same purpose. In summary, the extension reference voltages U1, U2, L1 and L2 expand the voltage range for the fine comparison and are used to ferret out any comparison error that occurs in the coarse comparing circuit.

In the conventional sub-range flash ADCs, coarse thermal codes, fine thermal codes and extension thermal codes are converted to a binary code format by using logic circuit 20 shown in FIG. 1. After conversion, logic circuit 20 also employs an error correction scheme to analyze the fine thermal codes and the extension thermal codes in order to correct the true digital output signal VO. That is, conventional ADCs correct the conversion error in the binary code format, not in the thermal code format. One example of such a correction circuit has been disclosed in IEEE JOURNAL OF SOLID-STATE CIRCUITS, VOL 25, NO. 6, entitled "A 10-b 15 MHz CMOS Recycling Two-Step A/D Converter". In this article, the conversion error is corrected by latches and mathematical operation units. All thermal codes are first transformed into the binary code format, and then are corrected by the mathematical correction scheme. However, it is evident that in the conventional sub-range flash ADC, many hardware devices are needed to perform such an operation. In terms of implementation, a large amount of chip size is required to fabricate this correction circuit.

SUMMARY OF THE INVENTION

Therefore, an object of the present invention is to provide a sub-range flash ADC which uses a different error correction method than the prior art ADCs. In this error correction method, the conversion error, induced by the inaccuracy of the coarse comparator, is directly corrected in the thermal code format. The resulting correction circuit for performing this error correction method is simpler than those of the prior art.

The present invention achieves the above-indicated objects by providing a sub-range flash ADC which includes a first correction circuit for dealing with the coarse thermal code generated by the coarse comparing circuit, and a second correction circuit for dealing with the fine thermal code generated by the fine comparing circuit. The first correction circuit shifts the coarse thermal codes left by one bit to obtain the modified coarse thermal codes when the intermediate analog signal is higher than the voltage range defined by the fine reference voltages, and shifts the coarse thermal codes right by one bit to obtain the modified coarse thermal codes when the intermediate analog signal is below the voltage range defined by the fine reference voltages. In addition, the second correction circuit shifts the fine thermal codes (including the extension thermal codes) right by a bit length equal to the fine thermal codes to obtain the modified fine thermal codes when the intermediate analog signal is higher than the voltage range defined by the fine reference voltages, and shifts the fine thermal codes (including the extension thermal codes) left by the bit length to obtain the modified fine thermal codes when the intermediate analog signal is below the voltage range defined by the fine reference voltages.

BRIEF DESCRIPTION OF THE DRAWINGS

The following detailed description, given by way of example and not intended to limit the invention solely to the embodiments described herein, will best be understood in conjunction with the accompanying drawings, in which:

FIG. 4A illustrates an input-level diagram of the fine conversion section in the second case of this embodiment;

FIGS. 4B, 4C and 4D show three situations (VI'>0, VI'=0 and VI'<0) in the first case of this embodiment, respectively;

FIG. 7 illustrates another example of the error-correction device employing multiplexers for performing the correction method disclosed in the present invention.

DETAILED DESCRIPTION OF THE PREFERRED EMBODIMENTS

In a preferred embodiment of the present invention, the coarse thermal codes QC and the fine thermal codes QF (including the extension thermal codes) are first processed for dealing with the inconsistency between the coarse comparison and the fine comparison. As described above, the conversion errors occur in the coarse comparing circuit, not in the fine comparing circuit. Therefore, according to the fine thermal codes QF accompanying the extension thermal codes, this kind of conversion error can be detected. In the following discussion, a 4-bit flash ADC with 2 MSBs and 2 LSBs is adopted for explaining the present invention. However, it is understood by those skilled in the art that the technique disclosed in the present invention can be easily applied to other sub-range flash ADCs with different bit lengths.

Figure 1:
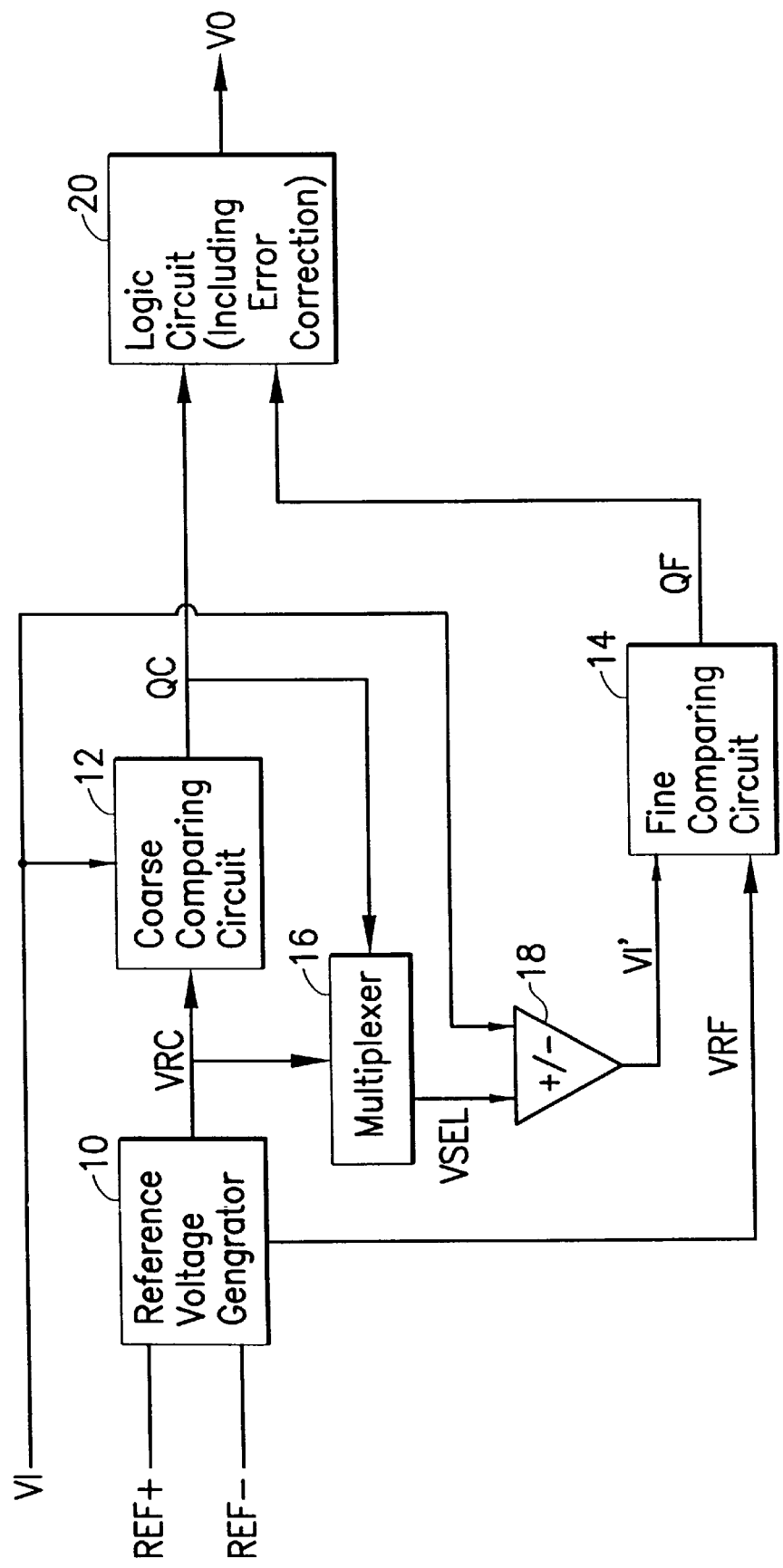
FIG. 1 (PRIOR ART) schematically illustrates the block diagram of the prior-art sub-range flash ADC.
Figures 2A, 2B:
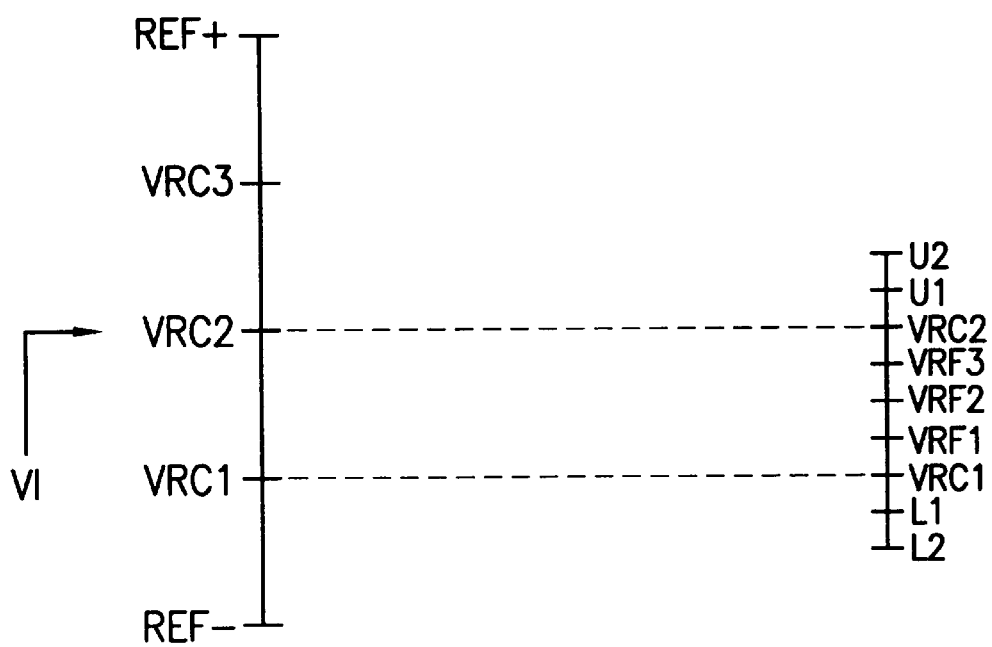
FIG. 2A (PRIOR ART) illustrates the conversion operation of a sub-range flash ADC in the coarse conversion scheme.
FIG. 2B (PRIOR ART) illustrates the conversion operation of a sub-range flash ADC in the fine conversion scheme

Referring to FIG. 2A, the following discussion focuses on a situation where the input analog signal VI is assumed to be very close to the coarse reference voltage VRC2. In addition, the relationship between the coarse thermal codes QC (including QC4, QC3, QC2 and QC1) and the corresponding converted digital signal (MSB) can be tabulated as Table I.

TABLE I

| Thermal code QC | Corresponding MSB |
| --- | --- |
| 0111 | 11 |
| 0011 | 10 |
| 0001 | 01 |
| 0000 | 00 |

Similarly, the relationship between the fine thermal codes QF (including QF4, QF3, QF2 and QF1) and the corresponding converted digital signal (LSB) is tabulated as Table II.

TABLE II

| Thermal code QF | Corresponding LSB |
| --- | --- |
| 0111 | 11 |
| 0011 | 10 |
| 0001 | 01 |
| 0000 | 00 |

Figure 3A:
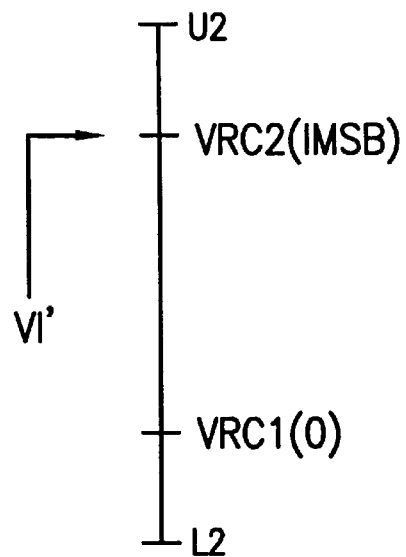
FIG. 3A illustrates an input-level diagram of the fine conversion section in the first case of this embodiment.
Figures 4A, 4B:
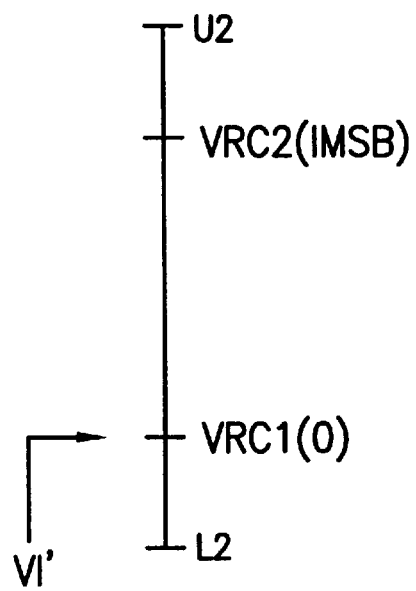

Based on the above information, two cases are considered in the following discussion, explaining how to correct the conversion error in the thermal code format. The first case is that the input analog signal VI is regarded as being located between the coarse reference voltages VRC1 and VRC2 by means of the coarse comparison, that is, the coarse thermal code is (0001). The second case is that the input analog signal VI is regarded as being located between the coarse reference voltages VRC2 and VRC3 by means of the coarse comparison, that is, the coarse thermal code is (0011). In the first case, the intermediate input signal VI' is the same as the input analog signal VI (that is, no movement). FIG. 3A illustrates an input-level diagram of the fine conversion section in the first case. As shown in FIG. 3A, the intermediate input signal VI' is close to the reference voltage VRC2, which represents 1 MSB input level in the fine comparison. Furthermore, three situations may happen in this case, that is, VI'>1 MSB, VI'=1 MSB and VI'=0, which will be discussed in detail later. On the other hand, in the second case, the intermediate input signal VI' is lower than the input analog signal VI by one coarse voltage range (or 1 MSB), indicating that a level movement toward the bottom reference voltage REF- has occurred. FIG. 4A illustrates an input-level diagram of the fine conversion section in the second case. As shown in FIG. 4A, the intermediate input signal VI' is close to the reference voltage VRC1, which represents a zero input level in the fine comparison. Similarly, three situations may happen in this case, that is, VI'>0, VI'=0 and VI'<0, which also will be discussed in detail later. The following discussion will discuss, one by one, how to correct the conversion error in these two cases, which respectively include three situations.

Figure 3B:
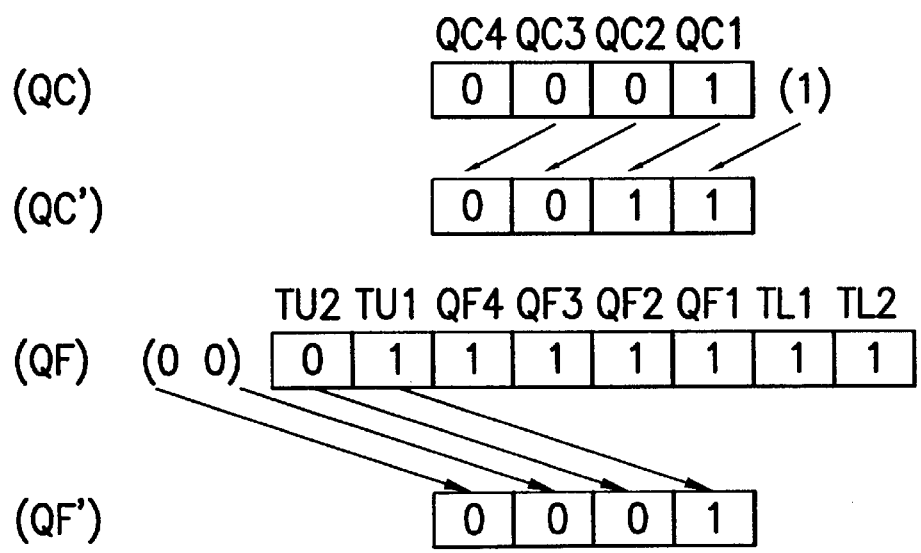
FIGS. 3B, 3C and 3D show three situations (VI'>1 MSB, VI'=1 MSB and VI'<1 MSB) in the first case of this embodiment, respectively.

First, we consider that the three situations of the first case shown in FIG. 3A. FIG. 3B shows the first situation of the first case, in which the thermal code QC2=0 and the intermediate input signal VI'>1 MSB. The coarse thermal codes QC are (0001) and the fine thermal codes QF (including the extension thermal codes TU2, TU1, TL1, TL1) are (01111111), as shown in FIG. 3B. The conversion error may be detected by verifying whether the fine and extension thermal codes QF has exceeded the normal range shown in Table II. Clearly, a conversion error has happened. In this case shown in FIG. 3B, the fine and extension thermal codes QF exceed their normal range, which means the current coarse thermal codes QC are over-estimated, and the current fine and extension thermal codes are under-estimated. Therefore, the correction for the conversion error can be made by shifting the current coarse thermal codes QC left (addition) by one bit to obtain modified coarse thermal codes QC' (0011) and shifting the current fine and extension thermal codes QF right (subtraction) by four bits to obtain modified fine thermal codes QF' (0001). For keeping the thermal code format, this correction operation must supplement any unfilled bit caused by left shifting, such as the coarse thermal codes QC in this case, with a bit "1", and any unfilled bit caused by right shifting, such as the fine and extension thermal codes QF in this case, with a bit "0." Now, the modified coarse thermal codes QC' and the modified fine thermal codes QF' represent the correct conversion result of the input analog signal.

Figure 3C:
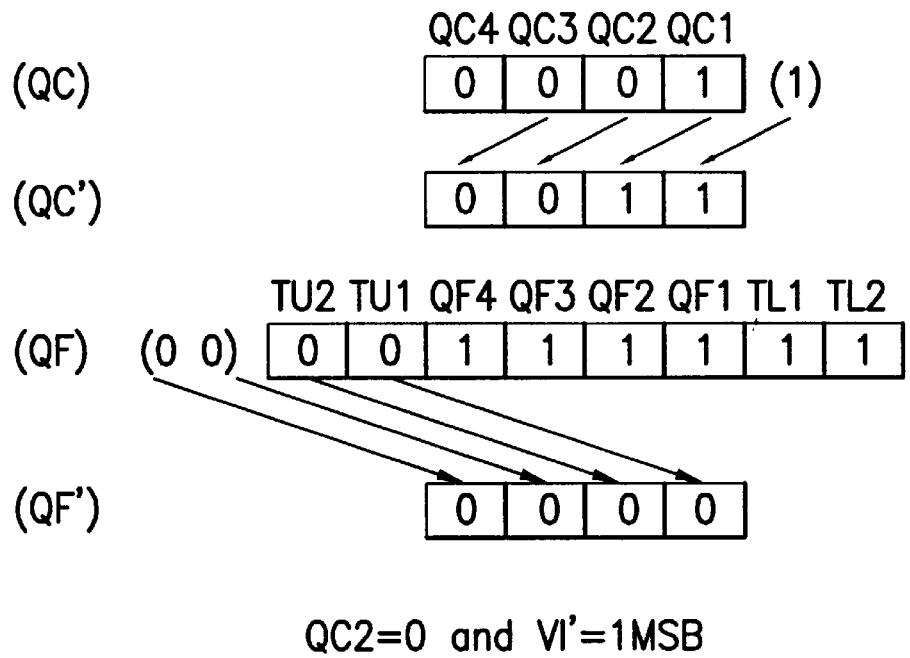

FIG. 3C shows the second situation of the first case, in which the thermal code QC2=0 and the intermediate input signal VI'=1 MSB. The coarse thermal codes QC are (0001) and the fine and extension thermal codes QF are (00111111), as shown in FIG. 3C. Because the fine and extension thermal codes QF also exceed the normal range shown in Table II, a conversion error has happened. Similarly, the correction for this conversion error can be made by shifting the current coarse thermal codes QC left (addition) by one bit to obtain a modified coarse thermal codes QC' (0011) and shifting the current fine and extension thermal codes QF right (subtraction) by four bits to obtain a modified fine thermal codes QF' (0000). During the shifting operation, a bit "1" is used to supplement an unfilled bit of the coarse thermal codes QC caused by left shifting, and two bits "0" are used to supplement two unfilled bits of the fine and extension thermal codes QF caused by right shifting. Now, the modified coarse thermal codes QC' (0011) and the modified fine thermal codes QF' (0000) represent the correct conversion result of the input analog signal in this case.

Figure 3D:
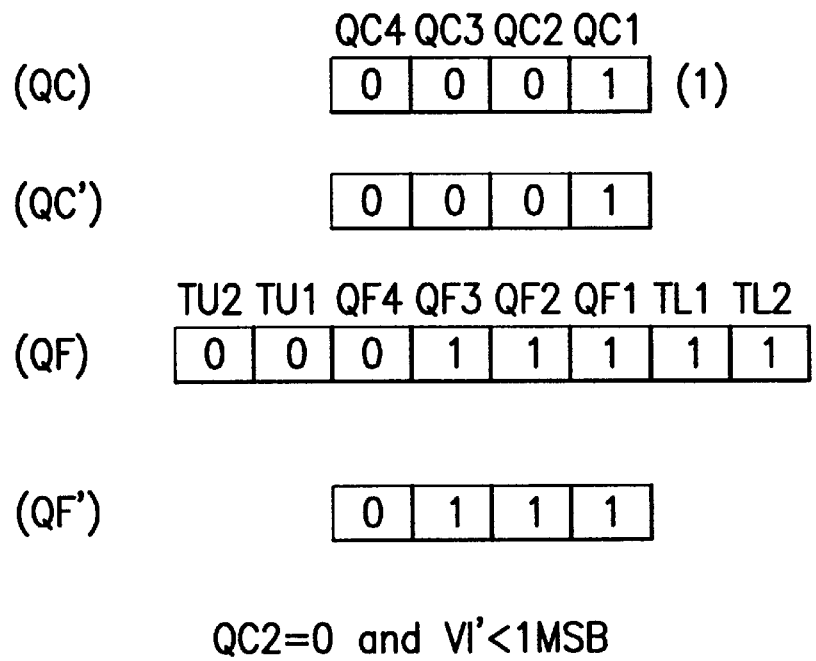

FIG. 3D shows the third situation of the first case, in which the thermal code QC2=0 and the intermediate input signal VI'<1 MSB. In addition, the coarse thermal codes QC are (0001) and the fine and extension thermal codes QF are (00011111), as shown in FIG. 3D. Because the fine and extension thermal codes QF are still located within the normal range shown in Table II, no conversion error has occurred. In this case, the coarse thermal codes QC(0001) and the fine thermal codes QF4, QF3, QF2 and QF1 (0111) are the correct conversion result for the input analog signal.

Next, we consider that the three situations of the second case shown in FIG. 4A. FIG. 4B shows the first situation of the second case, in which the thermal code QC2=1 and the intermediate input signal VI'>0. As shown in FIG. 4B, the current coarse thermal codes QC are (0011) and the fine and extension thermal codes QF are (00000111). Because the fine thermal codes QF4, QF3, QF2 and QF1 are still located with the normal range shown in Table II, no conversion error has occurred. In this case, the coarse thermal codes QC(0011) and the fine thermal codes QF4, QF3, QF2 and QF1 (0001) are the correct comparison result for the input analog signal in the comparing circuit.

FIG. 4C shows the second situation of the second case, in which the thermal code QC2=1 and the intermediate input signal VI'=0. As shown in FIG. 4C, the current coarse thermal codes QC are (0011) and the fine and extension thermal codes QF are (00000011). Because the fine thermal codes QF4, QF3, QF2 and QF1 are still located with the normal range shown in Table II, no conversion error has occurred. Therefore, the coarse thermal codes QC(0011) and the fine thermal codes QF4, QF3, QF2 and QF1 (0111) are the correct comparison result for the input analog signal.

FIG. 4D shows the third situation of the second case, in which the thermal code QC2=1 and the intermediate input signal VI'<0. In addition, the coarse thermal codes QC are (0011) and the fine and extension thermal codes QF are (00000001), as shown in FIG. 4D. Because the fine thermal codes QF4, QF3, QF2 and QF1 exceed the normal range shown in Table II, a conversion error has happened. Unlike the first case shown in FIGS. 3A to 3D, the current coarse thermal codes QC are over-estimated, and the current fine and extension thermal codes QF are under-estimated. Therefore, the correction for the conversion error can be made by shifting the current coarse thermal codes QC right (subtraction) by one bit to obtain modified coarse thermal codes QC' (0001) and shifting the current fine and extension thermal codes QF left (addition) by four bits to obtain modified fine thermal codes QF' (0111). During the shifting operation, a bit "0" is used to supplement an unfilled bit of the coarse thermal codes QC caused by right shifting, and two bits "1" are used to supplement two unfilled bits of the fine and extension thermal codes QF caused by left shifting. Now the modified coarse thermal codes QC' (0001) and the modified fine thermal codes QF4, QF3, QF2 and QF1 (0111) represent the correct conversion result of the input analog signal in this case.

According to the above discussion, the approach to correcting the conversion error by coarse comparison in the sub-range flash ADCs may be summarized as follows. The fine thermal codes accompanying by the extension codes may be used to decide whether a conversion error has happened and what kind of conversion error is produced. After determining that a conversion error has occurred, the coarse thermal codes are shifted right or left by one bit, similar to implementing an addition or subtraction mathematical operation, to obtain corrected coarse thermal codes. In addition, the fine thermal codes (including the extension thermal codes) are shifted left or right by a bit length equal to the fine thermal codes, similar to the subtraction and addition operation, to obtain corrected fine thermal codes. Finally, the corrected coarse and fine thermal codes are transmitted to an encoder for converting the thermal code format into the binary code format.

Figure 5:
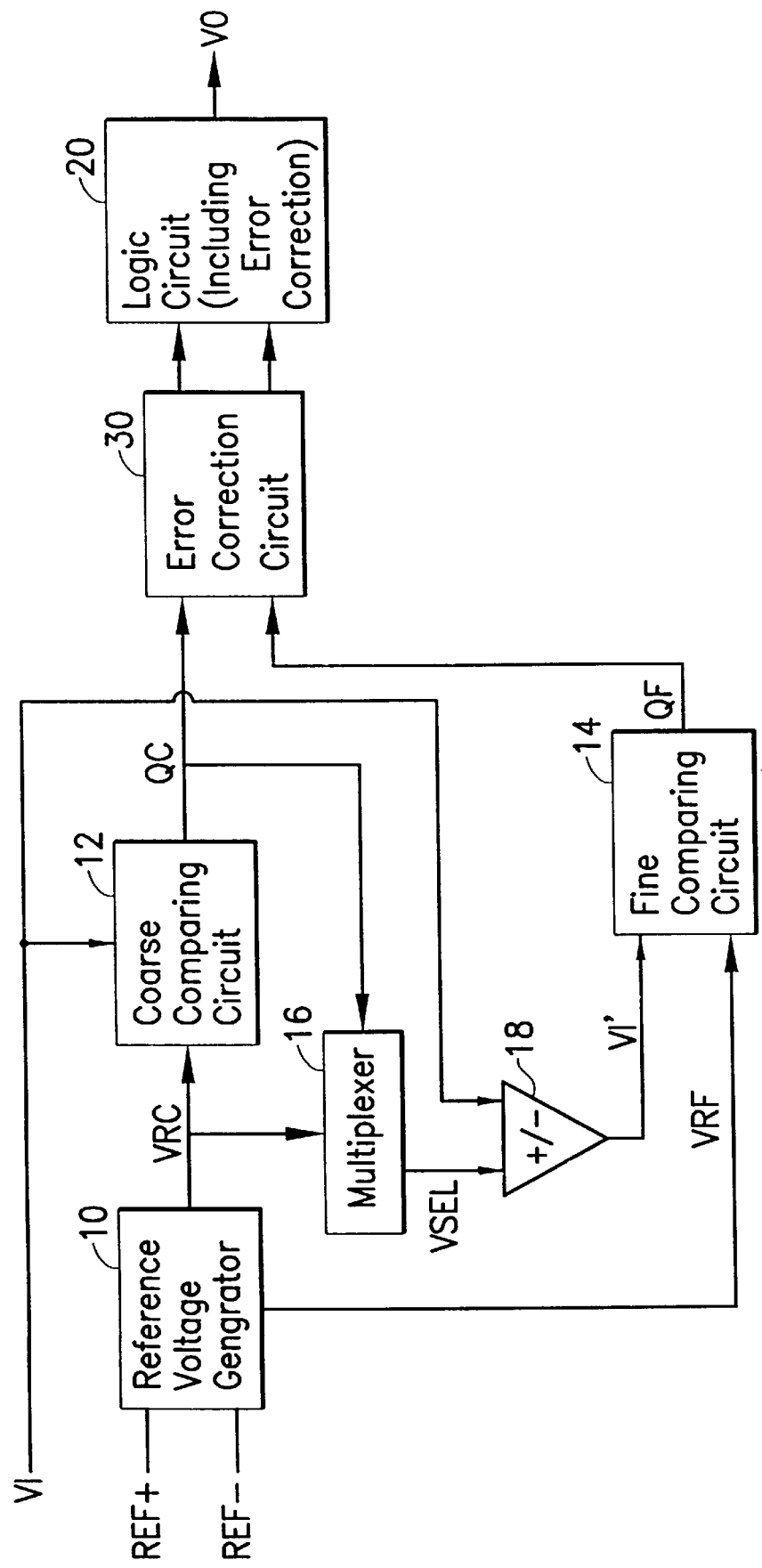
FIG. 5 illustrate a block diagram of a sub-range flash ADC employing the correction method disclosed in the present invention.
Figure 6:
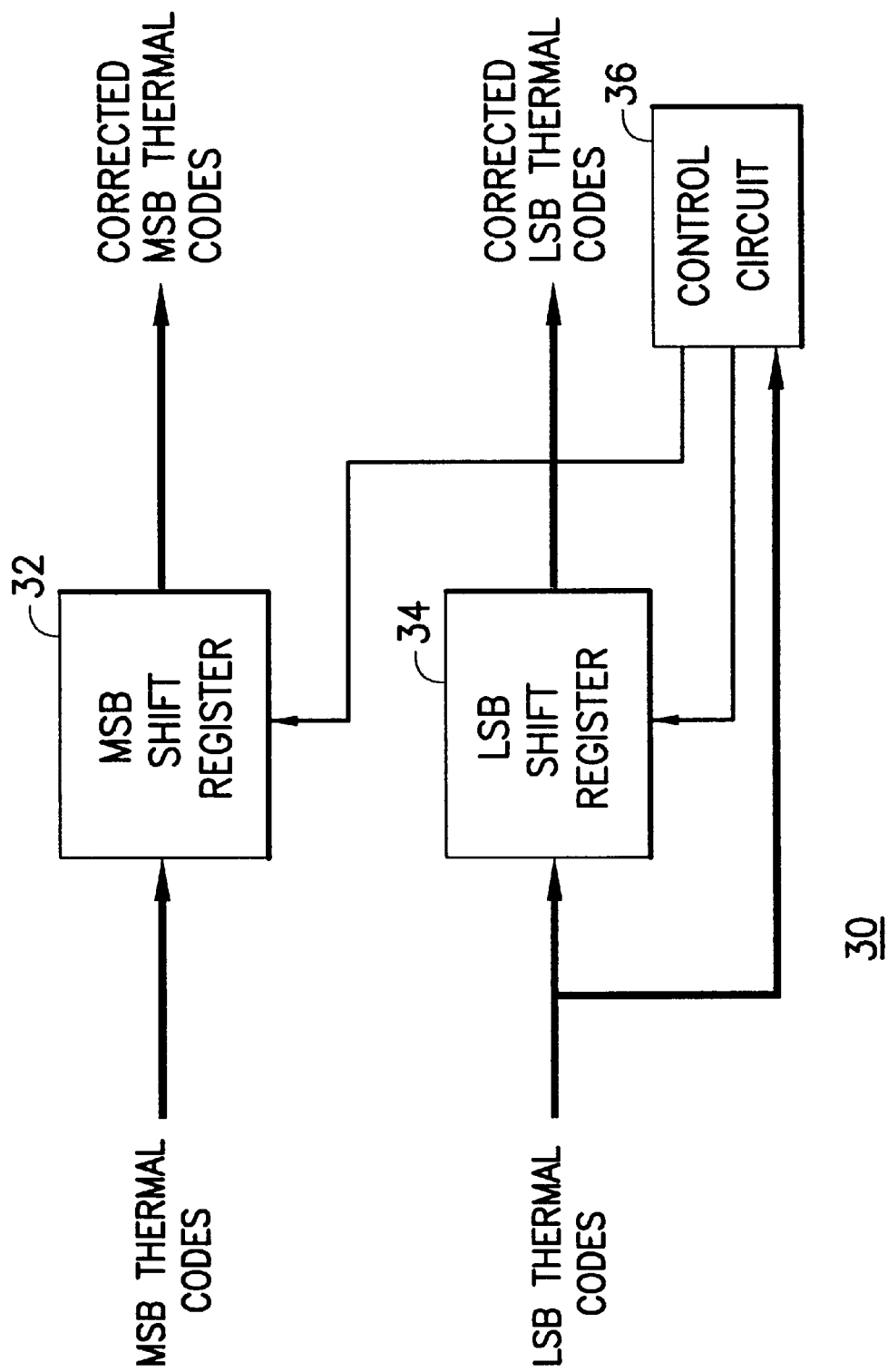
FIG. 6 illustrate an example of the error-correction device employing shift registers for performing the correction method disclosed in the present invention.

The above-indicated correction method can be implemented by an error-correction device 30 located ahead of the logic circuit 20 for processing the thermal codes generated by the comparators, as shown in FIG. 5. The following discussion illustrates two kinds of hardware devices for implementing error-correction device 30. One is to use shift registers to fulfill the bit-shifting operations, as shown in FIG. 6. Another is to use multiplexers to achieve the same performance as the shifting operations, as shown in FIG. 7.

FIG. 6 illustrates an example of error-correction device 30 employing shift registers to implement the correction method of the present invention. As shown in FIG. 6, error-correction device 30 comprises LSB shift register 32, MSB shift register 34 and control circuit 36. MSB shift register 30 and LSB shift register 32 are used to perform the bit-shifting operations as shown in FIGS. 3B–3D and FIGS. 4B–4D. Control circuit 36 generates two control signals for controlling the desired bit-shifting operations and sends them to MSB shift register 32 and LSB shift register 34, according to the LSB thermal codes. This is a straightforward way to implement the correction method disclosed in the present invention.

FIG. 7 illustrates another example of error-correction circuit 30 employing multiplexers to implement the correction method of the present invention. As shown in FIG. 7, error-correction device 30 comprises MSB multiplexer 2, LSB multiplexer 4 and control logic 6. Control circuit 6 is used to verify whether a conversion error has happened and what kind of conversion error it is, and generate two control signals to MSB multiplexer 2 and LSB multiplexer 4, respectively. More specifically, the two control signals are fed to selection terminals of MSB multiplexer 2 and LSB multiplexer 4, for selecting a group of thermal codes from three groups of preset thermal codes as the corrected MSB thermal codes and the corrected LSB thermal codes. As depicted in FIG. 5, multiplexer 2 or multiplexer 4 receives three groups of the preset thermal codes. The first group of the thermal codes received by MSB multiplexer 2 consists of the left-shifted MSB thermal codes, such as QC3, QC2, QC1, and a supplemented data bit "1" in this embodiment. The second group of the thermal codes received by MSB multiplexer 2 consists of the original MSB thermal codes, such as QC4, QC3, QC2 and QC1 in this embodiment. The third group of the thermal codes received by MSB multiplexer 2 consists of the right-shifted MSB thermal codes, such as a supplemented data bit "0," QC4, QC3 and QC2 in this embodiment. The three groups of the preset thermal codes are used to obtain the shifting result described in the above discussion.

Similarly, LSB multiplexer 4 also receives another three groups of the thermal codes, denoted by the right-shifted LSB thermal codes, the original LSB thermal codes and the left-shifted LSB thermal codes. The right-shifted LSB thermal codes include two supplemented data bits "00," TU2 and TU1. The original LSB thermal codes include QF4, QF3, QF2 and QF1. Furthermore, the left-shifted LSB thermal codes include TL1, TL2 and two supplemented data bits "11." According to the control signals generated by control circuit 6, MSB multiplexer 2 and LSB multiplexer 4 can produce the same correction operation described above.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A sub-range flash analog-to-digital converter for converting an input analog signal to an output digital signal having a fixed bit length, said sub-range flash analog-to-digital converter comprising:

a reference voltage generator for generating a plurality of coarse reference voltages for coarse comparison, a plurality of fine reference voltages for fine comparison and a plurality of extension reference voltages for correcting the mismatch between the coarse comparison and the fine comparison;

a coarse thermal code generator for receiving the input analog signal, comparing the input analog signal with the coarse reference voltages, and generating a first set of thermal codes associated with most significant bits of the output digital signal;

a fine thermal code generator for receiving the input analog signal, comparing an intermediate analog signal proportional to the input analog signal with the fine reference voltages and the extension reference voltages, and generating a second set of thermal codes associated with least significant bits of the output digital signal and a third set of thermal codes associated with the comparison of the intermediate analog signal and the extension reference voltages;

a first correction circuit for modifying the first set of the thermal codes in response to the second and the third sets of the thermal codes and generating a set of modified coarse thermal codes, when the second and third sets of the thermal codes indicate that the intermediate analog signal is out of a voltage range defined by the fine reference voltages;

a second correction circuit for modifying the second set of the thermal codes in response to the second and third sets of the thermal codes and generating a set of modified fine thermal codes, when the second and third sets of the thermal codes indicate that the intermediate analog signal is out of a voltage range defined by the fine reference voltages; and an encoder for generating the output digital signal according to the modified coarse thermal codes and the modified fine thermal codes.

2. The sub-range flash analog-to-digital converter as recited in claim 1, further comprising:

a control circuit for generating a first control signal and a second control signal in response to the second and third of the thermal codes, the first control signal being transmitted to the first correction circuit to perform the modifying operation and the second control signal being transmitted to the second correction circuit to perform the modifying operation.

3. The sub-range flash analog-to-digital converter as recited in claim 2, wherein the first and second correction circuits are implemented by shift registers controlled by the first control signal and the second control signal, respectively.

4. The sub-range flash analog-to-digital converter as recited in claim 2, wherein the first and second correction circuits are implemented by multiplexers controlled by the first control signal and the second control signal, respectively.

5. The sub-range flash analog-to-digital converter as recited in claim 1, wherein the first correction circuit shifts the first set of the thermal codes left by one bit to obtain the modified coarse thermal codes when the intermediate analog signal exceeds the voltage range defined by the fine reference voltages, and shifts the first set of the thermal codes right by one bit to obtain the modified coarse thermal codes when the intermediate analog signal is below the voltage range defined by the fine reference voltages.

6. The sub-range flash analog-to-digital converter as recited in claim 1, wherein the second correction circuit shifts the second and third sets of the thermal codes right by a bit length equal to the second set of the thermal codes to obtain the modified fine thermal codes when the intermediate analog signal exceeds the voltage range defined by the fine reference voltages, and shifts the second and third sets of the thermal codes left by the bit length to obtain the modified fine thermal codes when the intermediate analog signal is below the voltage range defined by the fine reference voltages.

7. The sub-range flash analog-to-digital converter as recited in claim 1, wherein the extension reference voltages includes a plurality of upper voltages higher than the fine reference voltages and a plurality of lower voltages below the fine reference voltages.

* * * * *